(12) United States Patent
Purushothaman et al.

(10) Patent No.: US 7,750,479 B2
(45) Date of Patent: Jul. 6, 2010

(54) TREATMENT OF PLASMA DAMAGED LAYER FOR CRITICAL DIMENSION RETENTION, PORE SEALING AND REPAIR

(75) Inventors: Sampath Purushothaman, Yorktown Heights, NY (US); Muthumanickam Sankarapandian, Niskayuna, NY (US); Hosadurga Shobha, Niskayuna, NY (US); Terry A. Spooner, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 11/857,797

(22) Filed: Sep. 19, 2007

(65) Prior Publication Data
US 2008/0042283 A1 Feb. 21, 2008

Related U.S. Application Data

(63) Continuation-in-part of application No. 11/440,984, filed on May 25, 2006, now Pat. No. 7,446,058.

(51) Int. Cl.
*H01L 21/31* (2006.01)
*H01L 21/469* (2006.01)

(52) U.S. Cl. ............... 257/774; 438/618; 438/637; 438/686; 257/E21.576; 257/E21.577

(58) Field of Classification Search ............... 257/774; 438/618, 637, 650, 686
See application file for complete search history.

(56) References Cited

U.S. PATENT DOCUMENTS

| | | | |
|---|---|---|---|
| 4,591,480 A | 5/1986 | Morishita et al. | |
| 5,133,840 A | 7/1992 | Buchwalter et al. | |
| 5,221,449 A | 6/1993 | Colgan et al. | |
| 5,281,485 A | 1/1994 | Colgan et al. | |
| 5,900,443 A | 5/1999 | Stinnett et al. | |
| 5,930,669 A | 7/1999 | Uzoh | |
| 6,291,885 B1 | 9/2001 | Cabral, Jr. et al. | |

(Continued)

FOREIGN PATENT DOCUMENTS

CN          1527366 A          9/2004

(Continued)

OTHER PUBLICATIONS

Lane, Michael et al., "Interfacial Relationships in Microelectronic Devices." *Mat. Res. Soc. Symp. Proc.*, 766, 153 (2003).

(Continued)

*Primary Examiner*—Fernando L Toledo
(74) *Attorney, Agent, or Firm*—Scully, Scott, Murphy & Presser, P.C.; Louis J. Percello, Esq.

(57) ABSTRACT

An interconnect structure and method of fabricating the same in which the critical dimension of the conductive features are not altered by a plasma damaged layer are provided. In accordance with the present invention, a chemically etching dielectric material is subjected to a treatment step which modifies the density of the dielectric material such that the treated surfaces become denser than the bulk dielectric not subjected to the treatment. The treatment step is performed prior to deposition of the noble metal liner.

19 Claims, 3 Drawing Sheets

U.S. PATENT DOCUMENTS

| | | | |
|---|---|---|---|
| 6,312,793 B1 | 11/2001 | Grill et al. | |
| 6,429,519 B1 | 8/2002 | Uzoh | |
| 6,437,440 B1 | 8/2002 | Cabral, Jr. et al. | |
| 6,437,443 B1 | 8/2002 | Grill et al. | |
| 6,479,110 B2 | 11/2002 | Grill et al. | |
| 6,677,251 B1 | 1/2004 | Lu et al. | |
| 6,800,928 B1 | 10/2004 | Lee et al. | |
| 6,838,300 B2 | 1/2005 | Jin et al. | |
| 6,861,355 B2 | 3/2005 | Marsh | |
| 6,921,722 B2 | 7/2005 | Ogure et al. | |
| 7,179,758 B2 | 2/2007 | Chakrapani et al. | |
| 7,446,058 B2 * | 11/2008 | Yang et al. | 438/781 |
| 2004/0175501 A1 | 9/2004 | Lukas et al. | |
| 2004/0175957 A1 | 9/2004 | Lukas et al. | |
| 2004/0227243 A1 | 11/2004 | Perng | |
| 2004/0229453 A1 | 11/2004 | Perng | |
| 2005/0106762 A1 | 5/2005 | Chakrapani et al. | |
| 2005/0133920 A1 | 6/2005 | Liou et al. | |
| 2005/0184397 A1 | 8/2005 | Gates et al. | |
| 2006/0189133 A1 * | 8/2006 | Dimitrakopoulos et al. | 438/687 |

FOREIGN PATENT DOCUMENTS

WO    WO2006/049595 A1    5/2006

OTHER PUBLICATIONS

Lane, M. W. et al., "Liner Materials for Direct Electrodeposition of Cu." *Apl. Phys. Ltrs.* vol. 83 (12) (2003).

* cited by examiner

TREATMENT OF PLASMA DAMAGED LAYER FOR CRITICAL DIMENSION RETENTION, PORE SEALING AND REPAIR

RELATED APPLICATIONS

This application is a continuation-in-part (CIP) application of U.S. Ser. No. 11/440,984, filed May 25, 2006, now U.S. Pat. No. 7,446,058, the entire contents of which are incorporated herein by reference.

FIELD OF THE INVENTION

The present invention relates to a semiconductor structure and a method of fabricating the same. More particularly, the present invention relates to an interconnect structure that includes a dielectric material containing at least one opening located therein and having a surface portion and a bulk portion, wherein the surface portion of the dielectric material abutting the at least one opening has a density that is greater than the bulk portion of the dielectric material.

BACKGROUND OF THE INVENTION

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In current interconnect structures, a layer of plasma vapor deposited (PVD) TaN and a PVD Cu seed layer are used as a Cu diffusion barrier and plating seed, respectively, for advanced interconnect applications. However, with decreasing critical dimension, it is expected that the PVD-based deposition techniques will run into conformality and coverage issues. These, in turn, will lead to fill issues at plating, such as center and edge voids, which cause reliability concerns and yield degradation.

One way around this problem is to reduce the overall thickness of PVD material, and utilize a single layer of liner material which serves as both the diffusion barrier and plating seed. Another way around the aforementioned issue is the use of chemical vapor deposition (CVD) or atomic layer deposition (ALD) which result in better step coverage and conformality as compared with conventional PVD techniques. CVD or ALD ruthenium, Ru, and iridium, Ir, have the potential of replacing current PVD based barrier/plating seed for advanced interconnect applications. See, for example, M. Lane et al., "Liner Materials for Direct Electrodeposition of Cu", Appl. Phys. Letters, 83, n12, 2330 (2003) and M. Lane et al., "Interfacial Relationships in Microelectronic Devices", Mat. Res. Soc. Symp. Proc., 766, 153 (2003).

The use of CVD or ALD Ru, Ir or other like noble metal is also advantages since Cu and other like metal conductors exhibit good adhesion to noble metals such as, for example, Ru. Moreover, a noble metal-Cu system is thermodynamically stable and has been shown to be substantially immiscible. Furthermore, noble metals such as Ru do not oxidize easily and have a fairly low bulk resistivity. The low resistivity of such noble metals is a necessary feature for it to enable direct electroplating of Cu.

Despite the above advantages that can be obtained utilizing noble metal liners, recent experimental results have revealed poor adhesion between the noble metal liner and the dielectric interface. It is likely that a noble metal, such as Ru, bonds weakly with C and O, and this may be a fundamental problem with deposition of a noble metal directly onto a dielectric surface. Because of the poor noble metal/dielectric adhesion issue, wafer peeling problems have been observed during Cu electroplating and chemical-mechanical polishing (CMP).

In addition to the above problem, prior art processes for fabricating interconnect structures typically use a photoresist and lithography to provide openings within the dielectric material. The patterned photoresist formed during the lithographic step is stripped by a plasma process which tends to damage the sidewalls of the dielectric material. The commonly employed post plasma strip wet clean in dilute hydrofluoric acid (HF) leads to the dissolution of the plasma damaged (i.e., modified dielectric material sidewalls). This in turn results in the increase in line width of the trench after etching; the extent of change is typically greater when more aggressive plasma strip processes are employed, or when more porous ultra low k dielectric materials are employed.

One has to account for this change by lithographically printing and etching smaller trench widths such that the change in line width due to the wet clean step can be accommodated. This becomes increasingly difficult when more porous and lower dielectric constant dielectric materials are used (e.g., a greater increase in line width after wet clean) and finer line widths for gigascale integration are desired.

Using milder plasma strip processes and gentler wet cleans are not always desirable as the efficacy of removal of residual patterned layers (such as, for example, via fills or photoresist) and reactive ion etching (RIE) process induced residues is compromised leading to higher contact resistance and lower product yield.

In view of the above, there is a need for providing an interconnect structure in which the adhesion problem and/or increased line width problem induced by plasma etching have been addressed.

SUMMARY OF THE INVENTION

The present invention provides an interconnect structure and method of fabricating the same in which the adhesion between a chemically etched dielectric material and a noble metal liner is improved which enables the incorporation of a noble metal liner in advanced interconnect technology. The present invention also provides, in addition to or in combination with the above, an interconnect structure and method in which an increase in line width is avoided without changing the size of the lithographic patterning. In particular, and in regard to the later statement, the present invention provides an interconnect structure and method in which the etch resistance of the patterned dielectric material is improved such that during the wet cleaning subsequent to stripping of the patterned photoresist no substantial increase in line width is observed.

The inventive interconnect structure and method of fabricating the same also provides better electrical performance than conventional interconnect structures since more volume of the conductive feature is provided.

Another advantage of the present invention is that the inventive interconnect structure uses a single thin-film layer (i.e., a noble metal liner) as a diffusion barrier/plating seed layer instead of a conventional diffusion barrier and plating seed layer as required in conventional interconnect technology. As such, a lower cost interconnect structure is provided in which a noble metal diffusion barrier is used instead of both a diffusion layer and a plating seed layer.

In general terms, the interconnect structure of the present application comprises:

a dielectric material including at least one opening located therein and having a surface portion and a bulk portion, wherein said surface portion of said dielectric material abutting said at least one opening has a density that is greater than the bulk portion of the dielectric material;

a noble metal liner within said at least one opening; and an interconnect conductive material on said noble metal diffusion liner.

The at least one opening may include a line region, a via region and a line region or a combination thereof. Single and dual damascene interconnect structures are contemplated in the present invention. The present invention also contemplates closed-via bottom structures, open-via bottom structures and anchored-via bottom structures.

In addition to the interconnect structure mentioned above, the present invention also provides a method of fabricating the same. In general terms, the method of the present invention comprises:

forming at least one opening in a dielectric material;

treating exposed surfaces of said dielectric material at least within said at least one opening to densify said exposed surfaces and to form a denser surface region as compared to remaining portions of the dielectric material;

forming a noble metal liner within said at least one opening; and forming an interconnect conductive material on said noble metal liner within said at least one opening.

In one embodiment, the treating comprises thermal annealing. In another embodiment, the treating comprises a combined ultraviolet irradiation and thermal annealing. In yet a further embodiment, a silylation step is performed prior to the ultraviolet irradiation and/or the thermal annealing.

In a preferred embodiment, thermal annealing is used as the treating step and said thermal anneal is performed at a temperature from about 200° to about 450° C. for a duration of from about 1 to about 30 minutes.

As stated above, the inventive method, in particular the treating step, is utilized to improve the etch resistance of the dielectric material during dilute HF wet cleans used after RIE and plasma strip steps to remove residues. The invention further enables the use of aggressive plasma strips and wet cleans without incurring the attendant increase in the line widths observed in the prior art process described in the background section of this application.

DETAILED DESCRIPTION OF THE INVENTION

The present invention, which provides an interconnect structure with retained critical dimension as well as a method of fabricating the same, will now be described in greater detail by referring to the following discussion and drawings that accompany the present application. The drawings of the present application, which are referred to in greater detail herein below, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
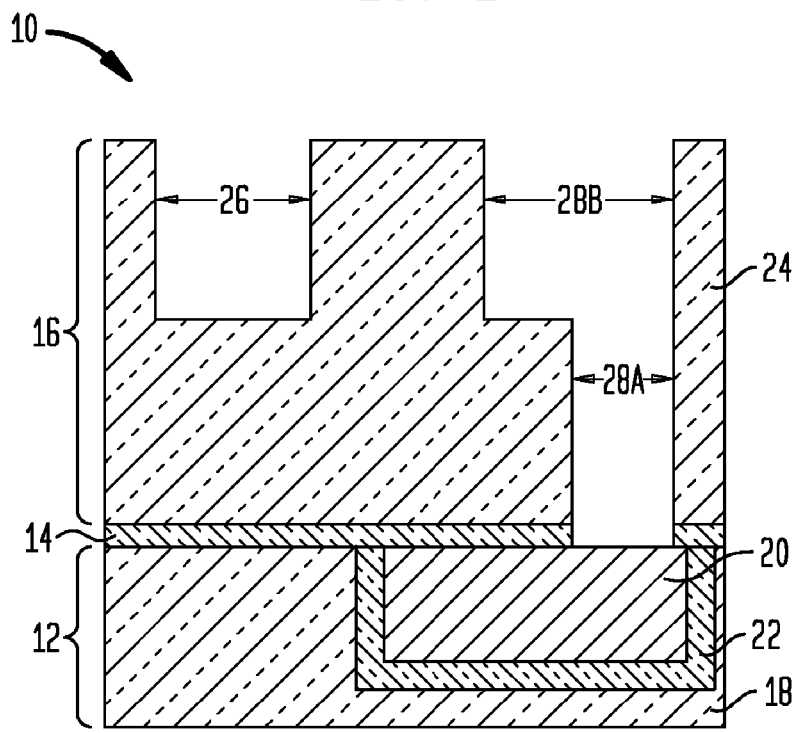
FIG. 1 is a pictorial representation (through a cross sectional view) illustrating an initial interconnect structure through early stages of the inventive method wherein at least one opening is provided into a dielectric material.

The process flow of the present invention begins with providing the initial interconnect structure 10 shown in FIG. 1. Specifically, the initial interconnect structure 10 shown in FIG. 1 comprises a multilevel interconnect including a lower interconnect level 12 and an upper interconnect level 16 that are optionally, but not necessarily always, separated in part by a dielectric capping layer 14. The lower interconnect level 12, which may be located above a semiconductor substrate including one or more semiconductor devices, comprises a first dielectric material 18 having at least one conductive feature (i.e., conductive region) 20 that is separated from the first dielectric material 18 by a barrier layer 22. The upper interconnect level 16 comprises a second dielectric material 24 that has at least one opening located therein.

Specifically, two openings are shown in FIG. 1; reference number 26 denotes a line opening for a single damascene structure, and reference numerals 28A and 28B denote a via opening and a line opening, respectively for a dual damascene structure. Although FIG. 1 illustrates a separate line opening and an opening for a via and a line, the present invention also contemplates cases in which only the line opening is present or cases in which the opening for the combined via and line is present.

The initial interconnect structure 10 shown in FIG. 1 is made utilizing standard interconnect processing which is well known in the art. For example, the initial interconnect structure 10 can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In additional to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous. Some examples of suitable dielectrics that can be used as the first dielectric material 18 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example oxygen, sulfur, sulfone, sulfoxide, carbonyl and the like.

The first dielectric material 18 typically has a dielectric constant that is about 4.0 or less, with a dielectric constant of about 2.8 or less being even more typical. All dielectric constants mentioned herein are relative to a vacuum. These dielectrics generally have a lower parasitic cross talk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from about 200 to about 450 nm.

The lower interconnect level 12 also has at least one conductive feature 20 that is embedded in (i.e., located within) the first dielectric material 18. The conductive feature 20 comprises a conductive region that is separated from the first dielectric material 18 by a barrier layer 22. The conductive feature 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the barrier layer 22 and then with a conducive material forming the conductive region. The barrier layer 22, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), sputtering, chemical solution deposition, or plating.

In some embodiments, not specifically shown herein, the first dielectric material 18 may include a modified dielectric surface layer having a reduced hydrophobicity and/or improved wet etch resistance (as is defined herein below in greater detail) which is formed prior to formation of the barrier layer 22 of the lower interconnect level 12. If present, the modified dielectric surface layer is located between the barrier layer 22 and the first dielectric material 18. Such a modified surface layer is formed utilizing the method of the present invention as well as the method defined in the parent application, i.e., treating by one of silylation, UV curing, thermal annealing or any combination thereof. Such dielectric surface treatment techniques, which provide a modified surface layer (hydrophobic and/or dense) on the dielectric material, will be described in greater detail herein below.

The thickness of the barrier layer 22 may vary depending on the exact means of the deposition process as well as the material employed. Typically, the barrier layer 22 has a thickness from about 4 to about 40 nm, with a thickness form about 7 to about 20 nm being more typical.

Following the barrier layer 22 formation, the remaining region of the opening within the first dielectric material 18 is filled with a conductive material forming the conductive region. The conductive material used in forming the conductive region includes, for example, polySi, a conductive metal, an alloy comprising at least one conductive metal, a conductive metal silicide or combinations thereof. Preferably, the conductive material that is used in forming the conductive region is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to: CVD, PECVD, sputtering, chemical solution deposition or plating. After these depositions, a conventional planarization process such as chemical mechanical polishing (CMP) can be used to provide a structure in which the barrier layer 22 and the conductive feature 20 each have an upper surface that is substantially coplanar with the upper surface of the first dielectric material 18.

After forming the at least one conductive feature 20, a dielectric capping layer 14 is optionally, but not necessarily always, formed on the surface of the lower interconnect level 12 utilizing a conventional deposition process such as, for example, CVD PECVD, chemical solution deposition, or evaporation. The dielectric capping layer 14 comprises any suitable dielectric capping material such as, for example, SiC, SiN, $SiO_2$, a carbon doped oxide, a nitrogen and hydrogen doped silicon carbide SiC(N,H) or multilayers thereof. The thickness of the capping layer 14 may vary depending on the technique used to form the same as well as the material make-up of the layer. Typically, the capping layer 14 has a thickness from about 15 to about 55 nm, with a thickness from about 25 to about 45 nm being more typical.

Next, the upper interconnect level 16 is formed by applying the second dielectric material 24 to the upper exposed surface of the optional capping layer 14, if present, or on a surface of the first dielectric material 18. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24.

Next, at least one opening is formed into the second dielectric material 24 utilizing lithography, as described above, and etching. The etching may comprise a dry etching process, a wet chemical etching process or a combination thereof. The term "dry etching" is used herein to denote an etching technique such as reactive-ion etching, ion beam etching, plasma etching or laser ablation.

In FIG. 1, two openings are shown; reference number 26 denotes a line opening for a single damascene structure, and reference numerals 28A and 28B denote a via opening and a line opening, respectively for a dual damascene structure. It is again emphasized that the present invention contemplates structures including only opening 26 or openings 28A and 28B.

In the instances when a via opening 28A and a line opening 2813 are formed, the etching step also removes a portion of the dielectric capping layer 14 that is located atop the conductive feature 20.

Figure 2:
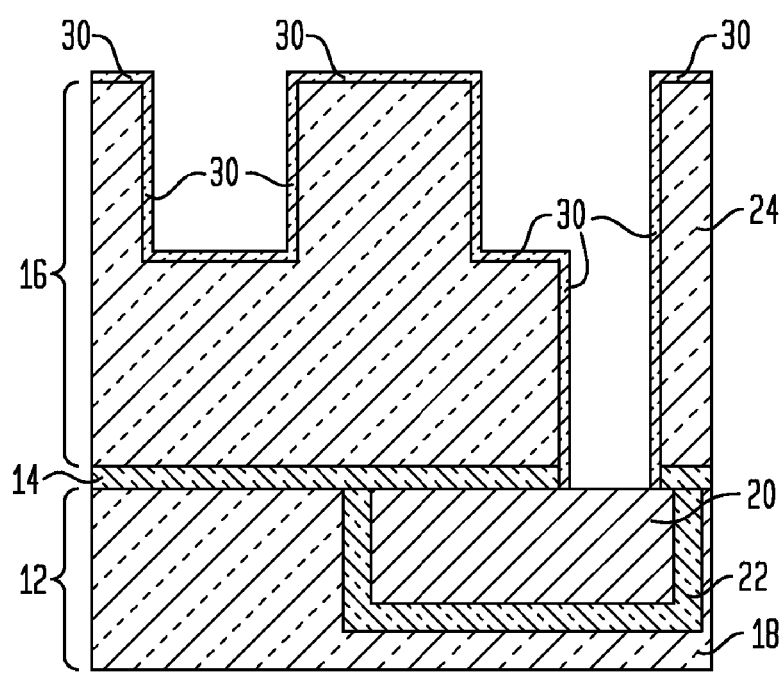
FIG. 2 is a pictorial representation (through a cross sectional view) illustrating the structure of FIG. 1 after creating a modified dielectric surface layer.

Reference is now made to FIG. 2 which shows the structure of FIG. 1 after creating a modified dielectric surface layer 30. As shown, the modified dielectric surface layer 30 is located on exposed surfaces of the second dielectric material 24. In accordance with the present invention, the modified dielectric surface layer 30 is a dielectric surface having a density that is greater than that of the bulk interconnect dielectric material that does not receive the treatment of the present invention. Hereinafter the modified surface layer 30 may also be referred to a surface portion that has a density that is greater than the bulk portion of the dielectric material. The dense dielectric surface layer (i.e., modified surface layer 30) substantially resistance to chemical etchants including, for example, acetic acid, oxalic acid, dilute hydrofluoric acid or combinations thereof.

The treatment step used in the present invention includes thermal annealing, UV irradiation (i.e., UV curing) or a combination of ultraviolet irradiation (i.e., UV curing) and thermal annealing. In some embodiments, the surface of the dielectric material is silylating prior to performing one of the above mentioned treatments which creates dense dielectric surface (i.e., modified surface) layer 30.

When silylation is employed, any silylation agent that is well known in the art can be used in the present invention. One class of silylating agents which can be used in the present invention has the general formula $(R_2N)_xSiR'_y$, where x and y are integers from 1 to 3 and 3 to 1, respectively, and R and R' are any of hydrogen, an alkyl, an alkoxy, an aryl, an allyl moiety or a vinyl moiety.

For the present application, the silylation can be performed in spin-on, liquid, vapor (in a furnace or in a CVD chamber), or supercritical $CO_2$ media, for example, as described fully in U.S. Patent Application Publication No. 2005/0106762 and U.S. Pat. No. 7,179,758, the entire contents of each are incorporated herein by reference.

For all cases, it is very important for the purpose of this invention to handle the silylating agent in the total absence of ambient moisture since any moisture that might be present could reduce the efficacy of the silylation reaction. Further, a combination of a silylation followed by an anneal or an anneal followed by a silylation or a high temperature (greater than 200° C.) silylation is preferred to silylation by itself as this results in the greatest decrease of silanol content in the dielectric film.

When the silylating agents are used in a liquid medium, they should preferably be dissolved in any non-polar organic solvent that has a low surface tension such that the pores can be penetrated effectively. Examples of such solvents include, but are not limited to: hexanes, heptanes, xylenes, propylene carbonates, etc. The concentration of aminosilanes necessary for effective silylation can be as low as 1% by weight of the solution or the silylating agent can be used as such in its undiluted liquid form. The desired range for the most effective silylation is 2% to 10% in solution. The solution can either be spin coated on to the dielectric film or used in a wet chemical tank in which the wafers with the interconnect features defined in the dielectric are immersed for a period ranging from 1 minute to 1 hour or more. The temperature for the silylation can either be room temperature (20°-30° C.) or higher. Following the silylation, the wafers can be rinsed off in the pure solvent and then baked on a hot plate or in a furnace to a temperature up to 450° C. When annealing is employed, the anneal temperature is typically about 200° C. or greater, with an annealing temperature from about 200° to about 350° C. being even more typical.

When thermal annealing is used as the treatment step, the thermal annealing is performed at a temperature from about 200° to about 450° C. for a duration of from about 1 minute to about 30 minutes. More preferably, the thermal annealing is performed at a temperature from about 250° to about 400° C. for a duration of from about 2 to about 15 minutes. Thermal annealing is typically performed in an inert ambient including one of He, Ar and $N_2$ or under vacuum. It is noted that other thermal annealing temperatures and/or times can be employed so long as the thermal annealing conditions are sufficient to form a denser surface layer as compared to the remaining bulk portion of the dielectric material.

When UV cure is employed in the present invention, the UV cure is performed in a conventional UV cure tool wherein the structure is subjected to a UV exposure step at a substrate temperature that is typically from about 200° to about 450° C. The UV exposure step is performed utilizing a source that can generate light having a wavelength from about 150 to about 500 nm, preferably from about 190 to about 250 nm, to irradiate the surface, especially the exposed surface of the dielectric material. The UV exposure step is performed for a time period from about 0.5 to about 100 minutes. The UV exposure may be performed in the presence of an ambient gas such as an inert gas including, for example, He, Ar, Xe, $N_2$ or a mixture thereof such as a forming gas $N_2/O_2$. Optionally, a chemically active gas may be added to the inert gas. Examples of chemically active gases that can optionally be used in the present invention include: $H_2$, $CH_4$, trimethylsiliane, ethylene or silane derivatives having the formula $HSiRR_1R_2$ wherein R, $R_1$ and $R_2$ may be the same or different and are selected from group consisting of methyl, ethyl, propyl, vinyl, allyl, methoxy and ethoxy.

When a combination of UV curing and thermal annealing is performed, the sequence of the treatments may be in any order, with the sequence of thermal annealing followed by UV curing being preferred over a sequence of UV curing and then thermal annealing.

The thickness of the modified dielectric surface layer 30 that is created may vary depending on the initial dielectric material employed as well as the exact treatment step employed. Typically, the modified dielectric surface layer 30 has a thickness from about 0.5 to about 8 nm, with a thickness from about 2 to about 4 nm being even more typical.

The modified surface layer 30 has a density greater than about 2.0 g/cc and more typically from about 2.0 to about 2.7 g/cc after performing the treatment step of the present invention. In comparison, the remaining bulk dielectric material has a density from about 0.8 to about 1.1 g/cc depending upon the dielectric constant and porosity levels.

Figure 3:
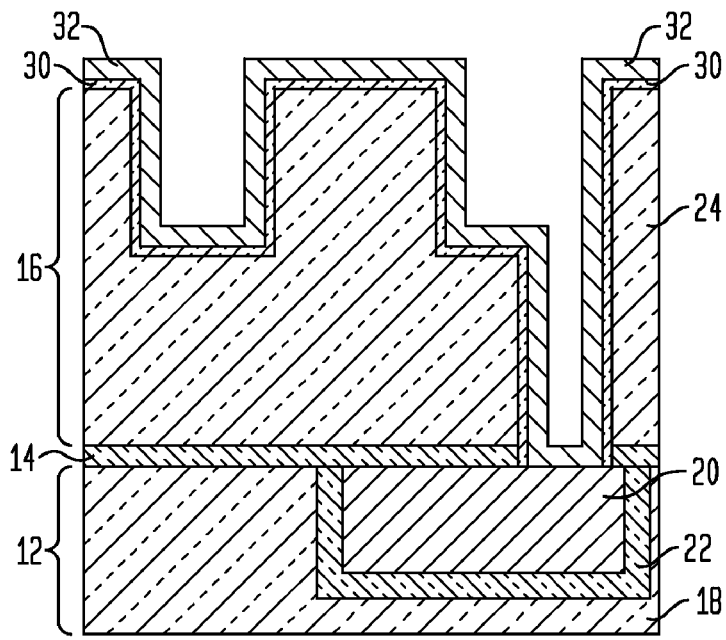
FIG. 3 is a pictorial representation (through a cross sectional view) illustrating the structure of FIG. 2 after forming a noble metal liner on said modified dielectric surface layer.

FIG. 3 shows the structure that is formed after forming a noble metal liner 32 on the exposed surface of the modified dielectric surface layer 30. The noble metal liner 32 is comprised of a metal or metal alloy from Group VIIIA of the Periodic Table of Elements. Examples of suitable Group VIIIA elements include, but are not limited to: Ru, Ta, Ir, Rh, Pt and alloys thereof such as, for example RuTa. In some preferred embodiments, Ru or RuTa is used as the noble metal liner. It is noted that the noble metal liner 32 of the present application serves as a diffusion barrier and, in some embodiments, as a plating seed layer as well.

The noble metal liner 32 is formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the noble metal liner 32 may vary depending on a number of factors including, for example, the compositional material of the noble metal liner 32 and the technique that was used in forming the same. Typically, the noble metal liner 32 has a thickness from about 0.5 to about 10 nm, with a thickness of less than 6 nm being even more typical.

Figure 4:
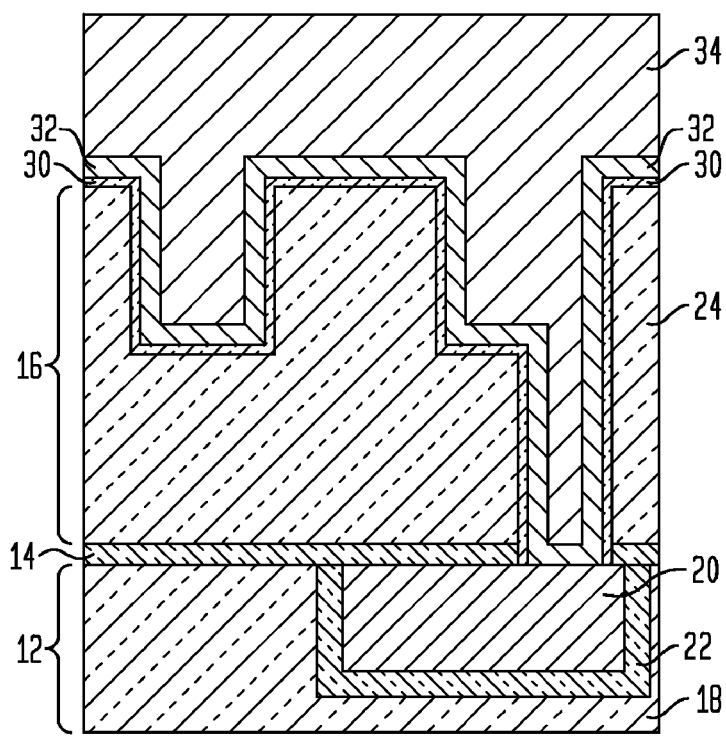
FIG. 4 is a pictorial representation (through a cross sectional view) illustrating the structure of FIG. 3 after deposition of an interconnect conductive material.

FIG. 4 shows the structure of FIG. 3 after filling the at least one opening within the second dielectric material 24 with an interconnect conductive material 34. The interconnect conductive material 34 may comprise the same or different conductive material as that present in conductive feature 20. Preferably, Cu, Al, W or alloys thereof are used, with Cu or AlCu being most preferred. The interconnect conductive material 34 is formed utilizing one of the deposition processes mentioned above in providing the conductive feature 20.

Figure 5:
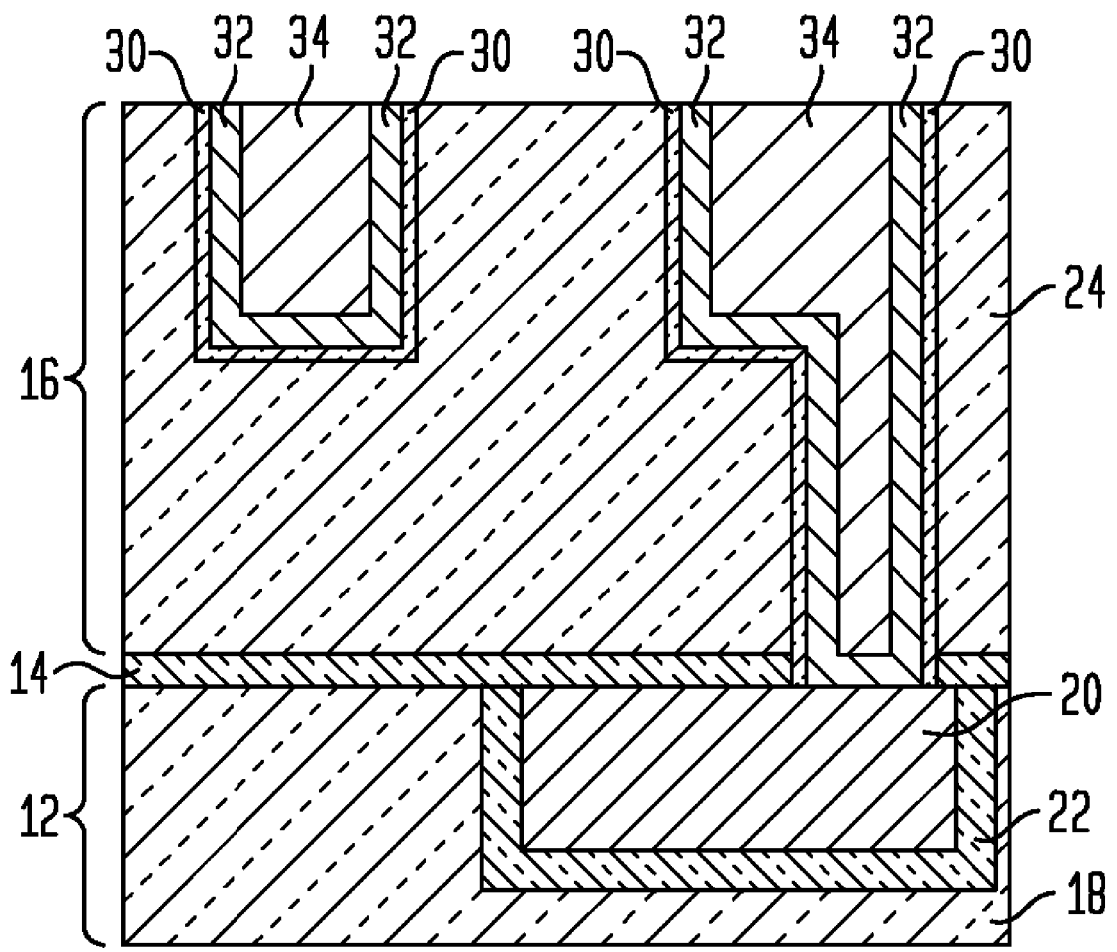
FIG. 5 is a pictorial representation (through a cross sectional view) illustrating the structure of FIG. 4 after planarization.

FIG. 5 shows the structure of FIG. 4 after performing a conventional planarization process such as, for example, grinding, chemical-mechanical polishing (CMP) or combinations thereof. Note that in FIG. 5 the upper surfaces of the second dielectric material 24, modified dielectric layer 30, the noble metal liner 32 and the interconnect conductive material 34 are substantially coplanar.

It is further noted that the structure shown in FIG. 5 represents a close-via bottom structure. In another embodiment of the present invention, an open-via bottom structure can be provided. In the open-via bottom structure, the interconnect conductive material 34 is in direct contact with a surface of the at least one conductive feature 20. The open-via bottom structure is formed by removing the noble metal liner 32 from the bottom of via 28A utilizing ion bombardment or another like directional etching process. The present invention also contemplates an anchored-via bottom structure. The anchored-via bottom structure is formed by first etching a recess into the conductive feature 20 utilizing a selective etching process. The selective etching typically occurs after performing the above mentioned dielectric surface modification. After formation of the noble metal liner, the noble metal liner is typically removed from the bottom portion of the via and recess by a directional etching process. The conductive material 34 is then formed as described above.

The following example is provided to illustrate the present invention and to demonstrate some advantages of utilizing the same.

In this example, a batch of 300 mm diameter silicon wafers were precleaned and coated with a 50 nm thick Si(CN) dielectric barrier film using a plasma enhanced CVD process known in the art. Next, a layer of a precursor film containing an organosilicate backbone and a pore forming labile organic agent (termed porogen) was deposited using a process similar to the one described in U.S. Pat. Nos. 6,312,793, 6,437,443 and 6,479,110.

The deposited film was then subjected to ultraviolet irradiation at 400° C. for a time range between 5 to 15 minutes to remove the labile porogen from the film and to enable good network crosslinking leading to an organosilicate film with a controlled volume fraction of pores with median diameter nominally less than 2 nm. The film process was tunable to produce ultra low-k (ULK) dielectrics with a k value between 2.2 and 2.4. Films with k=2.4 and 2.2 were utilized for the experiments described below. Following the deposition and curing to form a ULK film of 450 nm thickness, an organosilicate hardmask film of a higher k (of about 2.7 to 3.0) was deposited on top using a plasma CVD process known in the art.

To simulate the salient elements of plasma damage exposures encountered in the dual damascene process using a simplified structure, the following method was used in the present example. An organic via fill/planarization material (NFC1400 from JSR Corporation, Japan) was coated on top of the hard mask to a thickness of 300 nm. A low temperature oxide (LTO) of about 40 nm thickness was deposited by a PECVD process. This was followed by the application and curing of an organic spin on antireflective coating (ARC) and a photoresist layer over the top surface of the LTO. Lithographic imaging of a test pattern was performed using a 193 nm stepper (ASML 1200i). The pattern contained in particular two test macros of interest.

First, a comb capacitor structure to enable measurement of line to line capacitance which was sensitive to the line to line spacing and any change in the ULK dielectric constant due to plasma damage during etch and strip processes and second, an equally spaced line pattern at a nominal line width/pitch combinations of 100 nm/200 nm (for k=2.4 IMD) or 130 nm/260 nm (for k=2.2 dielectric material) respectively, were employed. The latter macro was sensitive to line width for a given line height and was used as an indicator of how well the line width critical dimension (CD) is retained due to the inventive approach used. Another attribute that was characterized was the hard mask undercut after the wet clean in dilute HF solution. This was the lateral undercut of the dielectric material relative to the hard mask in the region directly below the hard mask layer resulting from a faster etch rate of the plasma damaged dielectric material compared to the hard mask itself. It was highly desirable that this parameter was minimized as the undercut adversely affected the coverage of the dielectric material trench sidewalls surfaces by the barrier metal liner and plating seed layers due to shadowing effects.

In the control samples which were fabricated for comparison using the prior art process, the pattern in the resist was transferred successively into the ARC layer, LTO layer, organic via fill layer, the hard mask layer and to a controlled partial depth into the ULK film using appropriate reactive ion etch plasmas consisting of a mixture of inert gases, fluorocarbon gases and oxygen. This RIE sequence was followed by a plasma strip process in a mildly oxidizing plasma consisting of a combination of gases selected from ammonia, nitrogen, oxygen, and carbon dioxide to enable the full removal of the organic via fill/planarization layer. Specific details of these RIE and strip processes are known in the current state of the art. For the purpose of this experiment, it suffices to note that these were typically utilized in the dual damascene BEOL processing and, as will be shown through the experimental data, modify and damage the ULK dielectric to a measurable degree. As a last step, the structure was subjected to a second RIE process that simulated the etch step required to open the via contact holes in the SiCN layer required in a dual damascene (DD) structure.

At this point the ULK trench pattern (sidewalls and the bottom) was subjected to all the plasma exposures it was likely to encounter in a conventional DD build. As a last step to complete the creation of the trench, the control wafers were subjected to a room temperature wet cleaning in dilute HF to effect the removal of any residues from plasma processing and the exposed plasma damaged regions of the ULK film. In the present case etching in a 300:1 mixture of water and HF was employed in the wet clean step and the etch time was calibrated to be sufficient to remove 10 angstroms of a thermally grown silicon oxide. This etching process was designated as 10 Å DHF. Other HF dilutions and times can be employed depending on the dielectric material and plasma etch processes used. Also other wet cleaning solutions containing organic acids such as acetic acid, oxalic acid and the like which remove copper based oxides can be employed either by themselves or in sequential steps in conjunction with the dilute HF clean. As mentioned before, these clean steps lead to a change in the trench CD making it wider. These wafers will be referred to as control wafers in the ensuing discussion.

Additional wafers (denoted as Exemplary wafers) in the same lot were processed in the following manner. They were processed through all the steps up to and including all the RIE patterning, via fill strip and SiCN contact hole open steps. At this point the wafers were subjected to a densification treatment by thermal annealing or combined UV/thermal annealing as described in detail in this invention. Some of the wafers were subjected to a vapor phase silylation treatment using the method described above and then subjected to a 400° C./5 min thermal/UV anneal. The post plasma treatment exposure splits used are listed in Table 1. In this table, BDMADMS stands for the silylation agent bis(dimethylamino)dimethyl silane. Other agents described in U.S. Pat. No. 7,179,758 can also be used instead. The Exemplary wafers were then subjected to 10 Å DHF wet cleaning as in the case of the Control wafers.

TABLE I

| Example No. | Post plasma treatment |
| --- | --- |
| 1 (Control) | No UV |
| 2 (Control) | No UV |
| 3 (Exemplary) | 400° C./5 min thermal anneal |
| 4 (Exemplary) | 400° C./5 min thermal anneal |
| 5 (Exemplary) | 400° C./5 min UV/thermal anneal |
| 6 (Exemplary) | 400° C./5 min thermal/UV anneal |
| 7 (Exemplary) | 400° C./2 min thermal/UV anneal |
| 8 (Exemplary) | 400° C./2 min thermal/UV anneal |
| 9 (Exemplary) | 200° C./5 min thermal/UV anneal |
| 10 (Exemplary) | 200° C./5 min thermal/UV anneal |
| 11 (Exemplary) | BDMADMS silylation and 400° C./5 min thermal/UV anneal |
| 12 (Exemplary) | BDMADMS silylation and 400° C./5 min thermal/UV anneal |

At this point all the wafers (Control and Exemplary) were merged back into one group or lot and subjected to deposition of a liner metal and copper seed layer, trench fill by Cu electroplating, followed by CMP to planarize and achieve an inlaid damascene line structure. The CMP process was such that all the metal over burden and the organosilicate hard mask were polished off in the final structure. In addition to the novel noble metal liners described in this application, other liner metals known in the prior art such as TaN/Ta, TiN/Ti can also be used in the structure. In the present example TaN/Ta liners were employed.

All of the wafers were then electrically tested to measure resistance of the lines and the capacitance of the capacitor comb structures. Selected wafers from each set were cross sectioned and examined by scanning electron microscopy to determine trench CD and hard mask undercut aspects. The microscopy results are summarized in Table 2.

TABLE 2

| Sample ID | Condition | Hardmask undercut (nm) | Line width (nm) | Space between lines (nm) |
| --- | --- | --- | --- | --- |
| A (k = 2.2) | 400° C./5 min UV/thermal anneal + 10 Å DHF | 26.4 | 195.9 | 106.3 |
| A' (k = 2.2) | Control + 10 Å DHF | 41.2 | 236.5 | 67 |
| B (k = 2.4) | 400° C./5 min UV/thermal anneal + 10 Å DHF | Not measured | 104.2 | 88.3 |
| B' (k = 2.4) | Control + 10 Å DHF | Not measured | 122.2 | 74.25 |

Table 2 compares the line trench width (CD) and the hard mask undercut parameters for the Control and Exemplary wafers made with k=2.2 and k=2.4 dielectric films. It should be noted that a larger line to line pitch was used for the k=2.2 ILD wafers.

The key aspect to note is that for both dielectric materials, the Exemplary wafers subjected to the inventive treatments exhibit narrower trench width (CD) and smaller hard mask undercut values, indicative of improved resistance to attack by the DHF wet etch solution used.

This is further confirmed by the measured resistance values of densely spaced line patterns (nested lines macro) which were consistently higher for the Exemplary wafers compared to the Control wafers indicating that the line widths were indeed narrower. Correspondingly, the capacitance of the comb capacitor structures were consistently lower for the Exemplary wafers compared to the Control wafers indicating that for the given pitch the inter-line gap was larger in the former wafers and in agreement with the cross sectional microscopy measurements in Table 2. Consistent with the cross sectional measurements, both of these electrical measurements again confirmed that the line widths were narrower in the Exemplary wafers compared to the Control wafers.

From the resistance and capacitance data it was observed that while the thermal anneal alone at 400° C. provides some improvement, thermal annealing with simultaneous UV irradiation provided a greater improvement. Benefits of the combined thermal/UV treatment were increased by the anneal temperature (400° C. better than 200° C.) and with longer duration (5 minutes better than 2 minutes). Thus, it was demonstrated that the use of the UV/thermal annealing in the Exemplary wafers after plasma etch and strip processing exposures enabled the dielectric material to withstand the wet cleaning process without significant increase in the dielectric material trench widths. Densification of the dielectric material and cross linking of silanols in the plasma modified region of the dielectric during the UV/thermal anneal are likely causes of this improved robustness to wet etch exposures.

The greatest benefit was shown with the combined treatment which involved silylation treatment of the plasma damaged dielectric material followed by a 400° C./5 minutes combined thermal/UV anneal. The silylation treatment has been shown in the parent application, U.S. Ser. No. 11/440,984 and U.S. Pat. No. 7,179,758 to be beneficial in repairing the plasma damage to ULK dielectric materials and the combination of the same with the unexpected densification enabled by the thermal/UV treatment as described herein leads to the most improved wet etch resistance observed herein which is most likely due to the densification and increased hydrophobicity of the dielectric surface which was likely to retard the wetting of the surface by the aqueous HF solution.

The above illustrative experiment is meant to demonstrate by way of example only and not intended to limit the scope and range of the ways in which the above inventive treatments are utilized to impart an improved robustness of the ULK dielectric materials to wet cleaning exposures.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
    a dielectric material including at least one opening located therein, said at least one opening having sidewalls and said dielectric material having a modified surface portion and a bulk portion, wherein said modified surface portion of said dielectric material is present on an entirety of said sidewalls of said at least one opening and has a density that is greater than the bulk portion of the dielectric material;
    a noble metal liner within said at least one opening and located on at least an exposed upper surface of said modified surface portion of said dielectric material; and
    an interconnect conductive material on said noble metal diffusion liner.

2. The interconnect structure of claim 1 wherein said modified surface portion is substantially resistant to chemical etchants.

3. The interconnect structure of claim 1 wherein said dielectric material has a dielectric constant of about 4.0 or less.

4. The interconnect structure of claim 3 wherein said dielectric material comprises $SiO_2$, a silsesquioxane, a C doped oxide that includes atoms of Si, C, O and H, or a thermosetting polyarylene ether.

5. The interconnect structure of claim 1 wherein said at least one opening is a line opening, a combined line opening and a via opening, or combinations thereof.

6. The interconnect structure of claim 1 wherein said dielectric material is located atop an interconnect level including at least one conductive feature embedded within a dielectric having a dielectric constant of about 4.0 or less.

7. The interconnect structure of claim 1 wherein said noble metal liner comprises Ru, Ta, Ir, Pt or alloys thereof.

8. The interconnect structure of claim 1 wherein said interconnect conductive material comprises polySi, a conductive metal, an alloy comprising at least one conductive metal, a conductive metal silicide or combinations thereof.

9. The interconnect structure of claim 1 wherein said noble metal liner comprises a Ru-containing material, and said interconnect conductive material comprises a Cu-containing material.

10. The interconnect structure of claim 1 wherein said noble metal liner is present in a bottom portion of the at least one opening.

11. The interconnect structure of claim 1 wherein said noble metal liner is absent from a bottom portion of the liner, and said interconnect conductive material is in direct contact with an underlying conductive feature embedded within a lower interconnect level.

12. An interconnect structure comprising:
    a dielectric material including at least one opening located therein, said at least one opening having sidewalls and said dielectric material having a modified surface portion and a bulk portion, wherein said modified surface portion of said dielectric material is present on an entirety of said sidewalls of said at least one opening and has a density that is greater than the bulk portion of the dielectric material;
    a Ru-containing liner within said at least one opening and located on at least an exposed upper surface of said modified surface portion of said dielectric material; and
    a Cu-containing interconnect conductive material on said Ru-containing noble metal liner.

13. The interconnect structure of claim 12 wherein said modified surface portion is substantially resistant to chemical etchants.

14. A method of forming an interconnect structure comprising:
    forming at least one opening in a dielectric material;
    treating exposed surfaces of said dielectric material at least within said at least one opening to densify said exposed surfaces and to form a modified surface region that is denser as compared to remaining portions of the dielectric material, wherein said treating includes thermal annealing;
    forming a noble metal liner within said at least one opening and on at least an exposed upper surface of said modified surface region of said dielectric material; and
    forming an interconnect conductive material on said noble metal liner within said at least one opening.

15. The method of claim 14 wherein said thermal annealing is performed at a temperature from about 200° to about 450° C. for a duration of from about 1 to about 30 minutes.

16. The method of claim 14 wherein said treating comprises a combination of ultraviolet irradiation and said thermal annealing.

17. The method of claim 14 further comprising a silylation step, said silylation step is performed prior to said treating said exposed surfaces.

18. The method of claim 14 wherein said modified surface region is substantially resistance to chemical etchants.

19. The method of claim 18 wherein said chemical etchants include acetic acid, oxalic acid, dilute hydrofluoric acid or combinations thereof.

* * * * *